(12) United States Patent
Ou (10) Patent No.: US 8,253,512 B2
(45) Date of Patent: Aug. 28, 2012

(54) PRINTED CIRCUIT BOARD

(75) Inventor: Guang-Feng Ou, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 308 days.

(21) Appl. No.: 12/781,956

(22) Filed: May 18, 2010

(65) Prior Publication Data

US 2011/0193653 A1    Aug. 11, 2011

(30) Foreign Application Priority Data

Feb. 5, 2010  (CN) .......................... 2010 1 0301282

(51) Int. Cl.
*H03H 7/06* (2006.01)
(52) U.S. Cl. ......................... 333/172; 333/175; 333/181

(58) Field of Classification Search .................. 333/172, 333/175, 176, 181
See application file for complete search history.

(56) References Cited

U.S. PATENT DOCUMENTS

| | | | |
|---|---|---|---|
| 6,552,629 B2 * | 4/2003 | Dixon et al. .................. 333/172 |
| 7,945,322 B2 * | 5/2011 | Stevenson et al. ................ 607/2 |
| 8,115,571 B2 * | 2/2012 | Pietkiewicz et al. .......... 333/175 |

* cited by examiner

*Primary Examiner* — Seungsook Ham
(74) *Attorney, Agent, or Firm* — Altis Law Group, Inc.

(57) ABSTRACT

A low pass filter circuit includes an inductor and a capacitor. A first terminal of the inductor functions as an input to receive direct current voltage, and a second terminal of the inductor is connected to a first terminal of the capacitor through first and second conductor traces connected in series. A second terminal of the capacitor is grounded. Widths of the first and second conductor traces both range from about 2 mils to about 5 mils. A node between the first and second conductor traces outputs the direct current.

3 Claims, 8 Drawing Sheets

PRINTED CIRCUIT BOARD

BACKGROUND

1. Technical Field

The present disclosure relates to printed circuit boards, and more particularly to a printed circuit board eliminating voltage noise.

2. Description of Related Art

To accommodate miniaturization and power conservation, operating voltages of electronic devices are increasingly being reduced. However, lowering the operating voltage result in the electronic devices being more vulnerable to spurious noise. For current technology, once the operating voltage of the electronic device exceeds a threshold value, most electronic devices stops function, so it is necessary to add a filter circuit to eliminate voltage noise.

Figure 1:
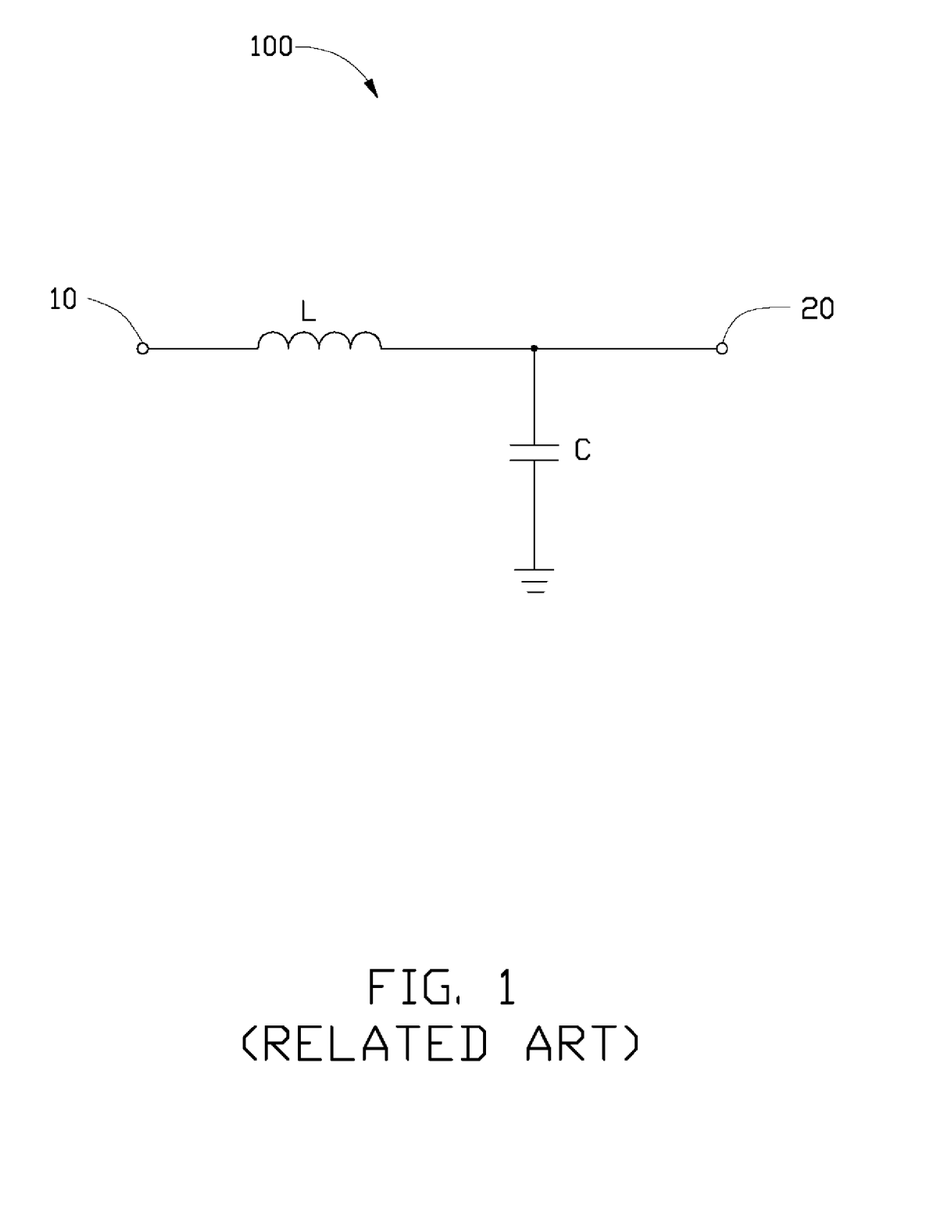
FIG. 1 is a circuit diagram of a frequently used low pass filter circuit.
Figure 2:
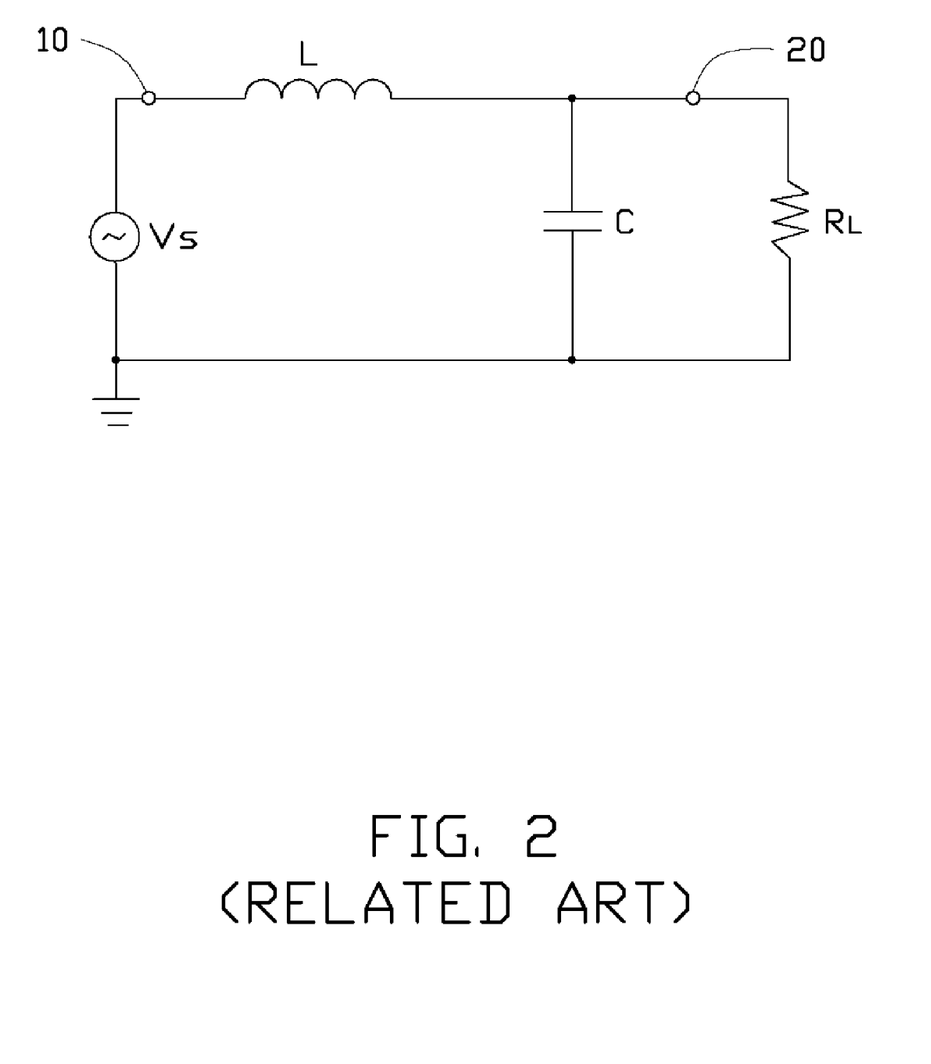
FIG. 2 is similar to FIG. 1, showing the circuit of FIG. 1 connected to an alternating current (AC) signal generator Vs and a load resistor.

Referring to FIGS. 1 and 2, a low pass filter circuit 100 is shown. The low pass filter circuit 100 includes an inductor L and a capacitor C. A first terminal of the inductor L functions as an input terminal 10 of the low pass filter circuit 100 receiving direct current (DC) voltage, a second terminal of the inductor L is grounded via the capacitor C and functions as an output terminal 20 of the low pass filter circuit 100 to output the DC to an electronic device. Inductance of the inductor L and capacitance of the capacitor C maintain constant, in order to test the amplitude-frequency characteristic of the low pass filter circuit 100, an alternating current (AC) signal generator Vs is connected to the input terminal 10 to act as a noise source, a load resistor RL is connected to the output terminal 20, and an oscillograph may be connected to the output terminal 20 to detect amplitude-frequency characteristics.

Figure 3:
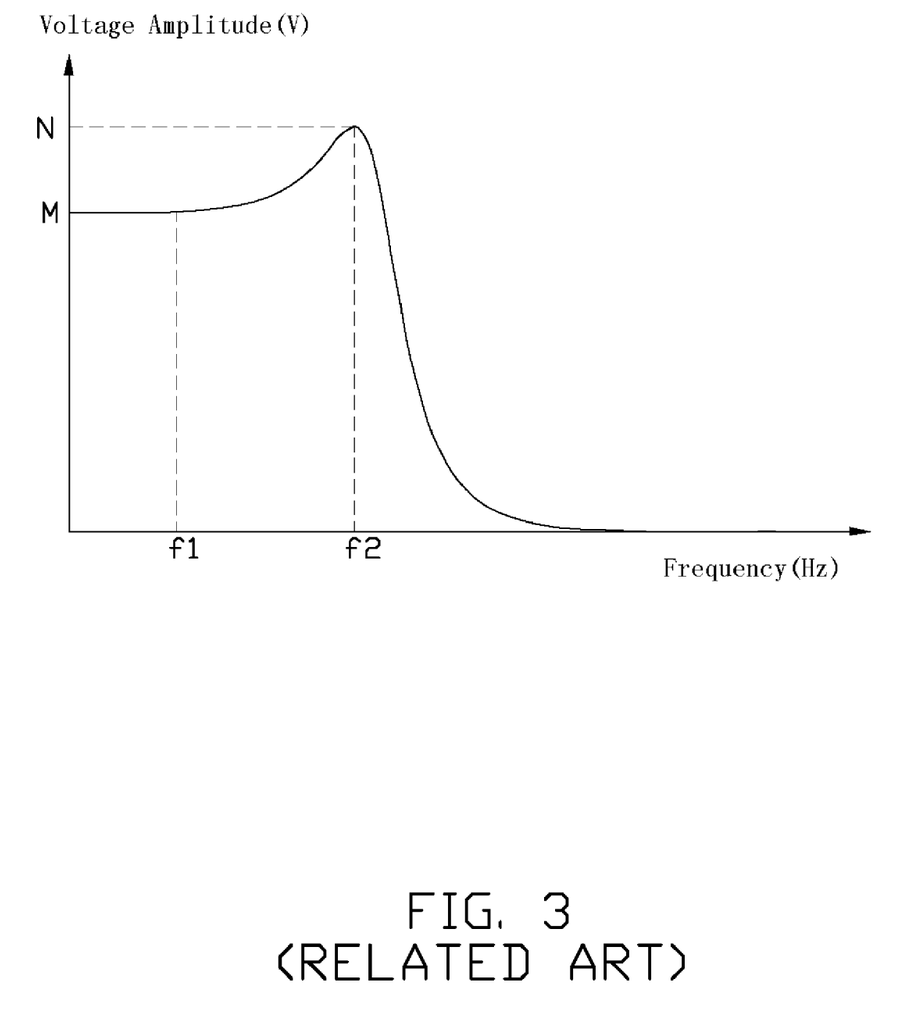
FIG. 3 is an amplitude-frequency waveform diagram of a voltage on the load resistor of FIG. 2.

Referring to FIG. 3, The AC signal generator Vs outputs an AC signal with an amplitude value M. A frequency of the AC signal gradually increases from zero hertzs (Hz). When the frequency of the AC signal falls below a frequency f1, the voltage amplitude of the output terminal 20 substantially equals the amplitude value M. When the frequency of the AC signal gradually increases from frequency f1 to f2, the voltage amplitude of the output terminal 20 gradually increases to a highest amplitude value N at the frequency f2. When the frequency of the AC signal increases from f2, the voltage amplitude of the output terminal 20 decreases. The low pass filter circuit 100 effectively amplifies the noise at the frequency f2, which can severely damage the electronic device.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 4:
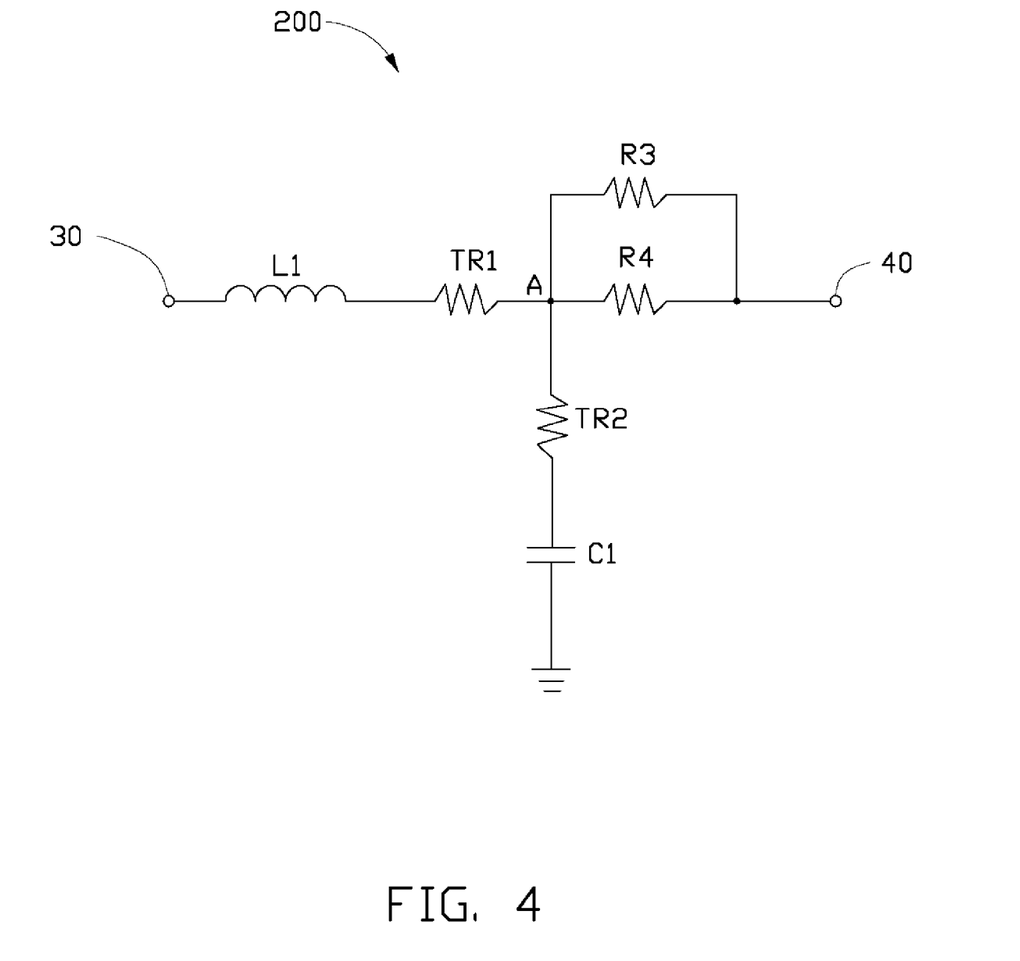
FIG. 4 is a circuit diagram of one embodiment of a low pass filter circuit.
Figure 5:
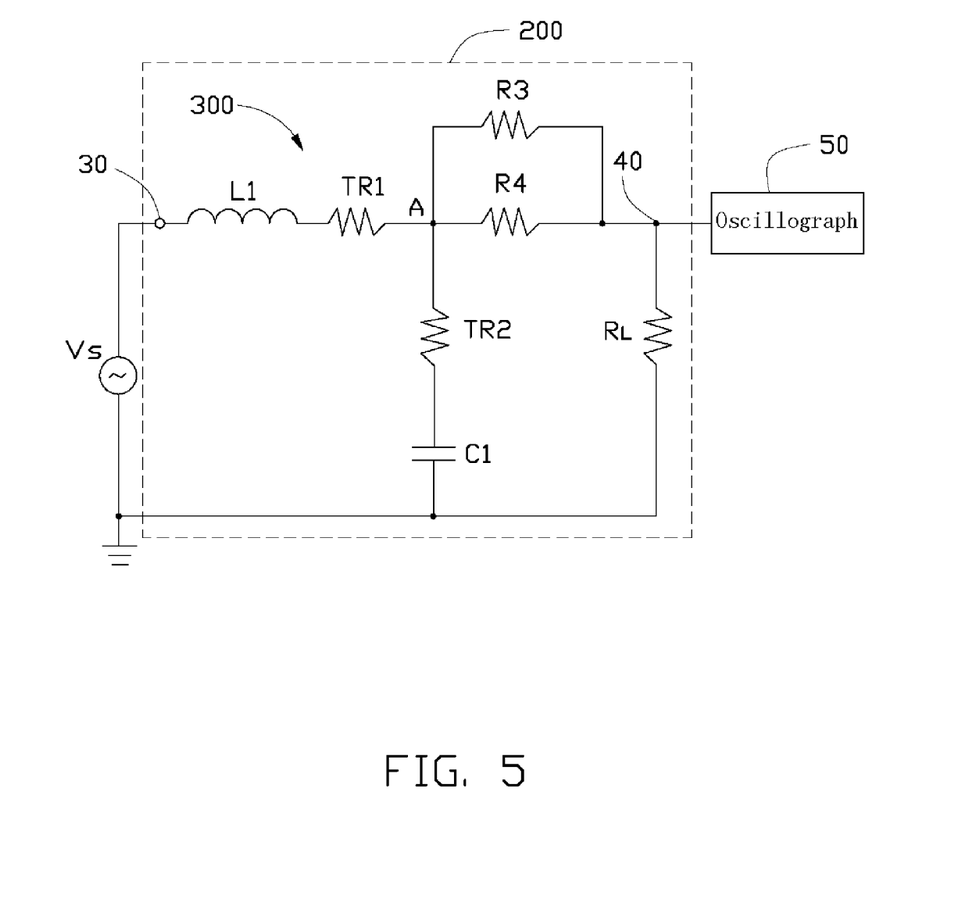
FIG. 5 is similar to FIG. 4, but shows the circuit connected to an AC signal generator Vs, an oscillograph, and a load resistor.

Referring to FIGS. 4 and 5, one embodiment of a printed circuit board 200 includes a low pass filter circuit 300. The low pass filter circuit 300 includes an inductor L1, a capacitor C1, and two zero-ohm resistors R3 and R4, both surface mounted. A first terminal of the inductor L1 functions as an input terminal 30 of the low pass filter circuit 300 to receive direct current (DC) voltage, a second terminal of the inductor L1 is connected to a first terminal of the capacitor C1 through a first conductor trace TR1 and a second conductor trace TR2 connected in series that are made of copper foil, wherein width of each of the conductor traces TR1 and TR2 ranges from about 2 mils to about 5 mils. A second terminal of the capacitor C1 is grounded. First terminals of the resistors R3 and R4 are both connected to a node A between the first and second conductor traces TR1 and TR2. Second terminals of the resistors R3 and R4 are connected together, functioning as an output terminal 40 to output the DC. The first conductor trace TR1 and the second conductor trace TR2 both have small resistance, respectively labeled as R1 and R2. In order to test the amplitude-frequency characteristic of the low pass filter circuit 300, an alternating current (AC) signal generator Vs is connected between the input terminal 30 and ground, to function as a noise source, and a load resistor RL is connected between the output terminal 40 and ground. An oscillograph 50 is connected to the output terminal 20, to detect the amplitude-frequency characteristic of the low pass filter circuit 300.

In one embodiment, the resistance R1 and R2 of the first and second conductor traces TR1 and TR2 may be increased by lengthening the first and second conductor traces TR1 and TR2, and reduced by shortening the first and second conductor traces TR1 and TR2.

An inductance of the inductor L1 equals 2.2 microhenry and a capacitance of the capacitor C1 equals 10 microfarad, the AC signal generator Vs outputs an AC signal with amplitude value M to the input terminal 30. The output terminal 40 outputs the AC signal.

Figure 6:
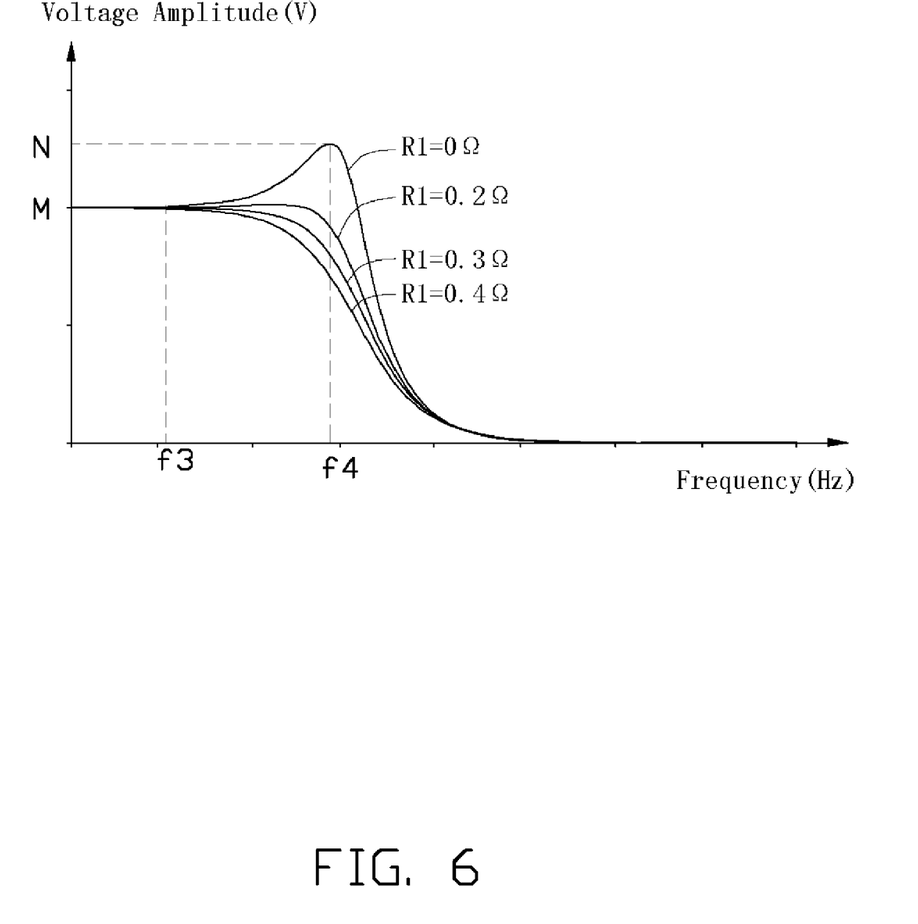
FIGS. 6 to 8 are amplitude-frequency waveform diagrams of a voltage on the load resistor of FIG. 5 corresponding to different resistances of the load resistor.

Referring to FIG. 6, when the resistance R1 and R2 of the first and second conductor traces TR1 and TR2 substantially equals 0Ω and the frequency of the AC signal is less than a frequency f3, the oscillograph 50 detects that an amplitude of the AC signal substantially equals the amplitude value M. When the frequency of the AC signal gradually increases to a frequency f4 from the frequency f3, the oscillograph 50 detects that the amplitude of the AC signal increases to an highest amplitude value N at the frequency f4. When the frequency of the AC signal increases from the frequency f4, the oscillograph 50 detects that the amplitude of the AC signal decreases.

When the resistance R2 of the second conductor trace TR2 substantially equals 0Ω, the resistance R1 of the first conductor trace TR1 is changed to 0.2Ω, 0.3Ω, and 0.4Ω in sequence, and oscillograph 50 detects cessation of the amplitude value at the frequency f4. Increased resistance R1 of the first conductor trace TR1 lowers the amplitude of the AC signal at the frequency f4.

Figure 7:
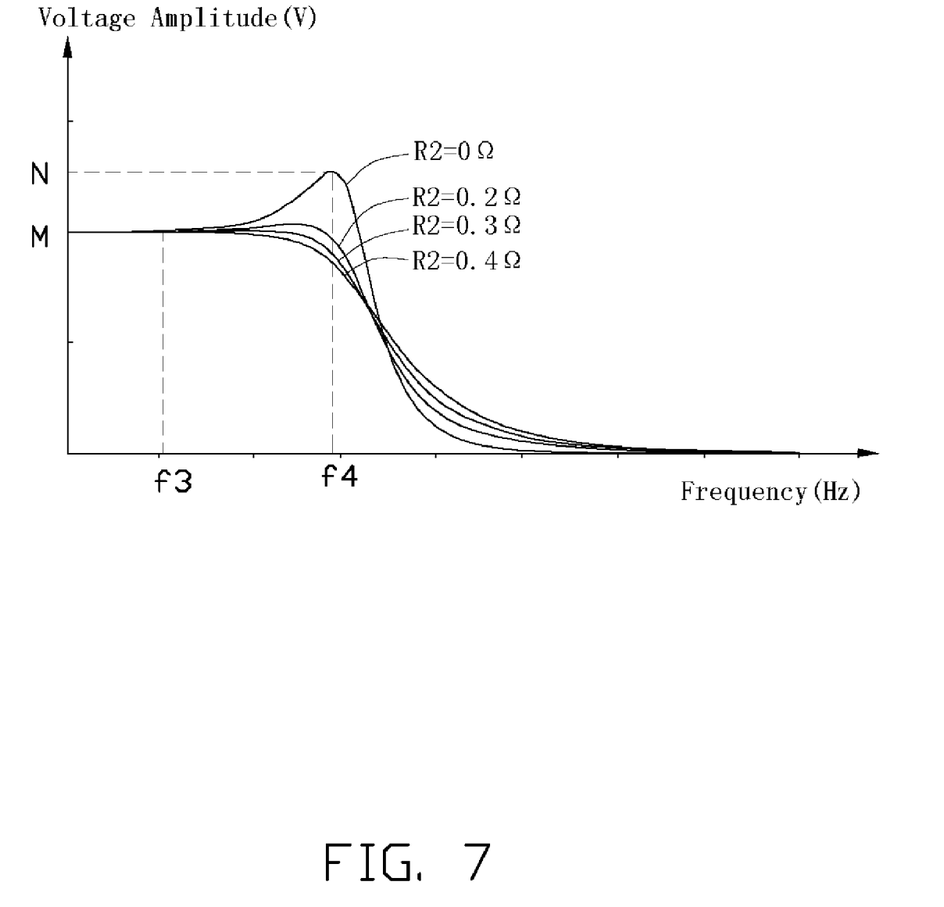

Referring to FIG. 7, when the resistance R1 of the first conductor trace TR1 substantially equals 0Ω, the resistance R2 of the second conductor trace TR2 is increased by lengthening the second conductor trace TR2, the resistance R2 is changed to 0.2Ω, 0.3Ω, and 0.4Ω in sequence, and the oscillograph 50 detects cessation of amplitude of the AC signal at the frequency f4. Increased resistance of the second conductor trace TR2 lowers amplitude of AC signal at the frequency f4.

Figure 8:
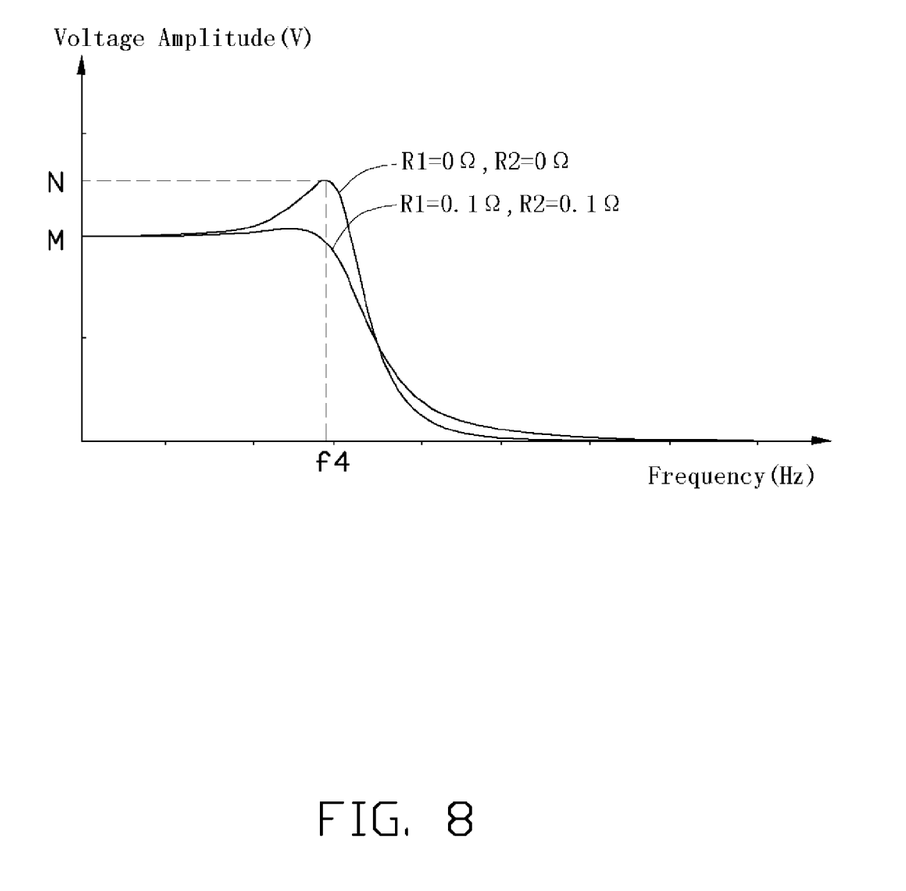

Referring to FIG. 8, when the resistance R1 and R2 of the first and second conductor traces TR1 and TR2 are both increased to 0.1Ω, amplitude of the AC signal at the frequency f4 is markedly diminished.

The surface mounted resistors R3 and R4 expand heat-dissipating area, so as to help dissipating heat generated by the first and second conductor traces TR1 and TR2. The volume of resistors R3 and R4 is small, conserving layout area for the printed circuit board.

In other embodiments, before amplitude-frequency characteristic testing, the low pass filter circuit 300 may be simulated by an application, such as Multism. During simulation, the first and second conductor traces TR1 and TR2 are respectively replaced with two resistors with resistance equaling that R1 and R2 of the first and second conductor traces TR1 and TR2. The lengths of the first and second conductor traces TR1 and TR2 can be worked out through the formula $R=\rho*L/S$, wherein R is length of the first conductor trace TR1 or the second conductor trace TR2, L is resistance R1 of the first conductor trace TR1 or R2 of the second conductor trace TR2, $\rho$ is resistivity of the first or second conductor traces TR1 or TR2, and S is a cross-sectional area of the first or second conductor trace TR1 or TR2. The resistances R1 and R2 of the first and second conductor traces TR1 and TR2 may also be regulated by other means, such as replacing the material of the first and second conductor traces TR1 and TR2.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A printed circuit board, comprising:
a low pass filter circuit, comprising an inductor and a capacitor, wherein a first terminal of the inductor functions as an input to receive direct current voltage, a second terminal of the inductor is connected to a first terminal of the capacitor through first and second conductor traces connected in series, a second terminal of the capacitor is grounded, wherein widths of the first and second conductor traces range from about 2 mils to about 5 mils, and a node between the first and second conductor traces outputs the direct current voltage.

2. The printed circuit board of claim 1, wherein the node between the first and second conductor traces outputs the direct current through at least one zero-ohm resistor, connected to the node between the first and second conductor traces to dissipate heat from the first and second conduction traces.

3. The printed circuit board of claim 2, wherein the at least one zero-ohm resistor comprises two zero-ohm resistors connected to the node in parallel.

\* \* \* \* \*